United States Patent
Luebke et al.

(10) Patent No.: US 9,057,752 B2
(45) Date of Patent: Jun. 16, 2015

(54) METHOD AND APPARATUS FOR DETECTING A LOOSE ELECTRICAL CONNECTION IN PHOTOVOLTAIC SYSTEM

(75) Inventors: Charles John Luebke, Hartland, WI (US); Xin Zhou, Wexford, PA (US); John J. Shea, Pittsburgh, PA (US); Birger Pahl, Milwaukee, WI (US); B. Thomas Pier, Milwaukee, WI (US)

(73) Assignee: Eaton Corporation, Cleveland, OH (US)

( * ) Notice: Subject to any disclaimer, the term of this patent is extended or adjusted under 35 U.S.C. 154(b) by 276 days.

(21) Appl. No.: 13/609,529

(22) Filed: Sep. 11, 2012

(65) Prior Publication Data

US 2014/0070833 A1    Mar. 13, 2014

(51) Int. Cl.
*G01R 31/26* (2014.01)
*G01R 31/02* (2006.01)
*H02S 50/10* (2014.01)

(52) U.S. Cl.
CPC ......... *G01R 31/026* (2013.01); *Y10T 29/49117* (2015.01); *H02S 50/10* (2014.12)

(58) Field of Classification Search
CPC .................. G01R 31/026; G01R 31/40–31/44
USPC ................................................... 324/761.01
See application file for complete search history.

(56) References Cited

U.S. PATENT DOCUMENTS

| | | | | |
|---|---|---|---|---|
| 4,695,788 | A * | 9/1987 | Marshall ........................ | 324/527 |
| 5,608,328 | A * | 3/1997 | Sanderson ..................... | 324/529 |
| 7,075,309 | B2 * | 7/2006 | Smith ............................ | 324/535 |
| 7,411,403 | B2 * | 8/2008 | Zhou ............................. | 324/500 |
| 2006/0254355 | A1 | 11/2006 | Zhou | |
| 2008/0211683 | A1 * | 9/2008 | Curt et al. ..................... | 340/652 |
| 2010/0237703 | A1 * | 9/2010 | Stern ............................. | 307/77 |
| 2011/0090607 | A1 * | 4/2011 | Luebke et al. ................ | 361/42 |
| 2011/0210750 | A1 * | 9/2011 | Medelius et al. ............. | 324/543 |
| 2011/0267721 | A1 * | 11/2011 | Chaintreuil et al. ......... | 361/2 |
| 2011/0308833 | A1 | 12/2011 | West | |
| 2012/0256584 | A1 * | 10/2012 | Crites .......................... | 320/107 |
| 2014/0070815 | A1 * | 3/2014 | Liu et al. ...................... | 324/510 |

FOREIGN PATENT DOCUMENTS

| | | | |
|---|---|---|---|
| CA | 2460828 | A1 * | 9/2005 |
| EP | 1918727 | A1 | 5/2008 |
| EP | 2442122 | A2 | 4/2012 |
| EP | 2442124 | A2 | 4/2012 |
| WO | WO-2012/000533 | A1 | 1/2012 |
| WO | WO-2012/100263 | A2 | 7/2012 |

OTHER PUBLICATIONS

International Search Report for PCT/US2013/058927 mailed Dec. 18, 2013.

* cited by examiner

*Primary Examiner* — Patrick Assouad
*Assistant Examiner* — Demetrius Pretlow
(74) *Attorney, Agent, or Firm* — Fishman Stewart Yamaguchi PLLC (57) ABSTRACT

A power circuit configured to generate and distribute DC electrical power, the power circuit includes a photovoltaic (PV) system that includes an array of PV modules electrically coupled to a combiner box, and an inverter positioned to receive DC electrical power from the array of PV modules and output AC electrical power. The PV system also includes a signal generator coupled to a first portion of the PV system, and a signal detector coupled to a second portion of the PV system, the signal detector configured to detect secondary signals generated at a loose connection of an electrical joint in the PV system, wherein the secondary signals result from a signal generated by the signal generator.

23 Claims, 7 Drawing Sheets

METHOD AND APPARATUS FOR DETECTING A LOOSE ELECTRICAL CONNECTION IN PHOTOVOLTAIC SYSTEM

BACKGROUND OF THE INVENTION

The present invention relates generally to DC electrical systems, and more particularly, to a method and apparatus for detecting a loose electrical connection in a photovoltaic (PV) system.

The US and other countries have been experiencing record numbers of PV installations in recent years. In one recent year, for instance, the US experienced 339 MW of grid-connected PV during the first 6 months of the year, which represents a 55% increase over the 435 MW that was installed in the entire previous year. Not only has the number of systems increased dramatically in recent years, but the number of large scale systems has increased as well.

Generally, as known in the art, a PV system includes individual solar modules that are connected in series to form a string of, typically, 8-12 modules. A group of strings are connected in parallel in a combiner box, which typically includes a fuse for each positive string wire, and the fuse(s) feed a positive bus bar. Negative wires are also collected within the combiner box to form a negative bus. Conductors sized to handle the combined current and voltage produced at the combiner boxes carry DC power to a master combiner (which may also be regarded as an array combiner or a re-combiner), where combiner box outputs are combined in parallel. Output from one or more master combiners travels through large conductors to a central inverter, and DC power from the master combiner is output as AC power from the inverter. The inverter output is fed to a transformer that converts the output AC voltage to the utility's transmission voltage.

PV systems are expected to be highly robust and reliable for at least twenty years of operation. However, like many high voltage electrical systems, PV systems are susceptible to failure due to, among other things, loose connections resulting in overheating and arcing that can occur in the system. Arcing is a luminous discharge of electricity across an insulating medium, usually accompanied by the partial volatilization of electrodes. An arc fault is an unintentional arcing condition in an electrical circuit and can be caused by, for instance, worn conductor insulation, exposed ends between broken conductors, faulty electrical connections, or loose connections where conducting elements are in close proximity to each other, as examples. Depending on the current, the plasma formed during an arcing fault can reach temperatures in excess of 5000 degree C. in a very localized area. This heating can be sufficient to melt surrounding components that are made of plastic or metal, such as fuse holder, parts of disconnect switches, and even the combiner box enclosure itself. This can lead to injury, equipment and property damage, and fires due to ignition of building or PV materials, threatening the loss of building contents and occupant safety.

PV systems are at risk of developing a fault due to the very large number of connections in the system. Thousands of connections can exist in a PV system, giving thousands of opportunities for poor connections. A large PV system can have over one hundred combiner boxes, as an example. Thus, there can be thousands or even many thousands of opportunities for faults to occur. Bus bar connections are typically bolted together, and there can be any number of these bolted structures within each combiner box. Within a combiner box, field terminated strings and bus feed wiring particularly have a high potential for developing loose connections, and bus bars and associated termination hardware also have the potential to become loose through electrical and thermal cycling. The risk of developing a fault is even higher for PV strings where the power propagates down the PV wiring, through PV connectors, as well as through PV module ribbon and cell interconnections.

More so, PV systems are particularly at risk because of damage from sun, wind and weather that can occur over system working life and from the conditions that occur where PV systems are typically installed. That is, the relatively harsh conditions on building roofs, in open fields, etc. . . . can lead to physical damage and accelerated aging of the PV system. Exposure to wind, harsh winter cold and extreme summer heat can weaken connections anywhere throughout the system, causing loose connections. And, because of the dramatic growth in the number of deployed PV systems in recent years, the risk of fire and other damage has only increased. In fact, PV fires have been reported in recent years that have been traced back to component overheating and arcing, particularly caused by loose connections.

Safety, protection, and service requirements for DC components and circuits in PV systems have lagged the code requirements, standards, and experience established for AC systems. Protection systems for AC power distribution have progressed from short circuit (fuses and circuit breakers) and overcurrent (protective relays) to ground fault and arc fault protection. One known AC loose connection detection/protection system, applicable to switchgear, switchboard, and motor control centers, is based on passive acoustical sensing with a piezo sensor and an Event Time Correlation (ETC) algorithm. That is, this known AC protection system detects acoustic noise generated within the system itself and, with the ETC algorithm, can be used to pinpoint the source of loose connections.

In other words, because of the cyclical nature of AC power and its passing through zero points, a loose connection within the AC system can manifest itself as a vibration between the loose components. The vibration in turn is detectable as an acoustic noise with piezo sensors positioned throughout the system. Based on the time of travel to one or more piezo sensors the locations of the source can be determined. As such, a loose connection within an AC system can be detected, often before the loose connection proceeds to the point where overheating or an arc may be formed.

DC power systems on the other hand, such as a PV system, do not inherently generate acoustic signals in loose connections. Generally the components remain in a static position if loose, unlike in a typical AC circuit, and will remain so until an arc forms. As such, DC power systems may not have loose connections detected therein, using known systems, until it is too late and the arc has formed, or worse yet when the arc has progressed to the point of becoming a fire hazard.

Further, a fault or loose connection in a PV system may not be detectable during darkness because the risk of arcing has abated when the system is not under power. Thus, in order to proactively detect faults or loose connections, the PV system must be monitored during daylight hours and when the PV modules are generating power.

As such, it would therefore be desirable to have a system and method capable of detecting loose connections in a DC electrical power circuit and, more particularly, in a PV system, that overcomes the aforementioned drawbacks.

BRIEF DESCRIPTION OF THE INVENTION

The present invention provides a system and method for detecting loose electrical connections in a photovoltaic (PV) system.

Therefore, in accordance with one aspect of the present invention, a power circuit configured to generate and distribute DC electrical power, the power circuit includes a photovoltaic (PV) system that includes an array of PV modules electrically coupled to a combiner box, and an inverter positioned to receive DC electrical power from the array of PV modules and output AC electrical power. The PV system also includes a signal generator coupled to a first portion of the PV system, and a signal detector coupled to a second portion of the PV system, the signal detector configured to detect secondary signals generated at a loose connection of an electrical joint in the PV system, wherein the secondary signals result from a signal generated by the signal generator.

According to another aspect of the present invention, a method of manufacturing a loose connection detection system in a photovoltaic (PV) circuit includes attaching a signal generator to the PV circuit such that a signal generated therefrom passes to a signal detector attached to the PV circuit, and attaching the signal detector to the PV circuit to detect secondary signals generated at a loose connection within the PV circuit that result from the signal generated by the signal generator.

In accordance with a further aspect of the present invention, a computer readable storage medium having stored thereon a computer program comprising instructions, which, when executed by a computer, cause the computer to generate a source signal in a signal generator that is attached to a photovoltaic (PV) electrical power circuit such that the source signal generated therefrom passes at least to an electrical connection between electrical components of the PV electrical power circuit, detect the source signal using a signal detector that is positioned to receive the source signal, and detect a secondary signal using the signal detector, the secondary signal generated at the electrical connection that results from a loose connection of the electrical components at the electrical connection.

Various other aspects, features, and advantages of the present invention will be made apparent from the following detailed description and the drawings.

BRIEF DESCRIPTION OF THE DRAWINGS

The drawings illustrate one preferred embodiment presently contemplated for carrying out the invention.

DETAILED DESCRIPTION OF THE PREFERRED EMBODIMENT

The present invention relates generally to a system and method for detecting loose electrical connections in a photovoltaic (PV) system.

Figure 1:
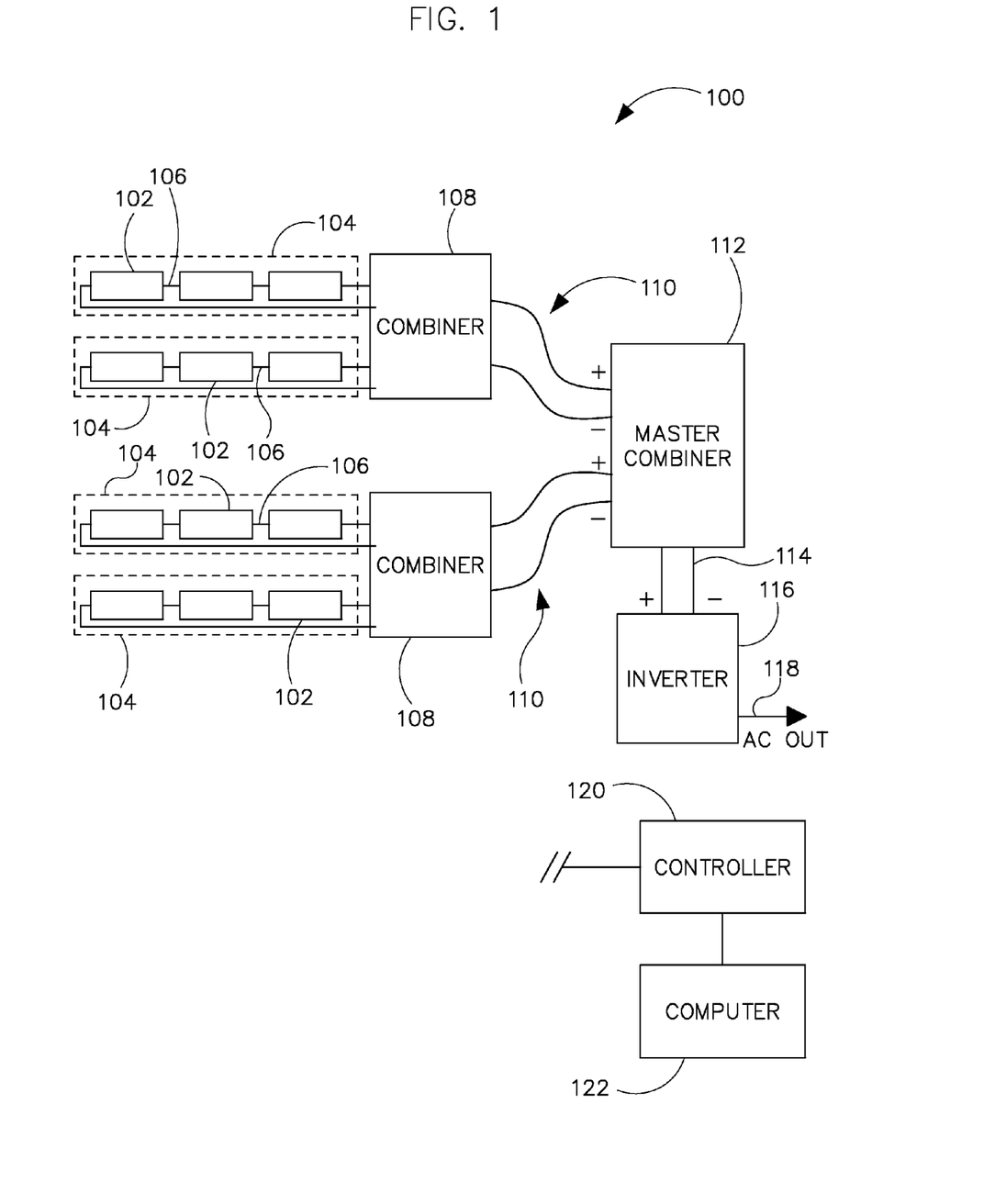
FIG. 1 is a photovoltaic (PV) system incorporating embodiments of the invention.

Referring to FIG. 1, a photovoltaic (PV) system 100 includes individual PV modules 102 that are arranged as module strings 104 which, in the illustrated case, are linear strings having three modules 102 in each. As known in the art, the number of modules need not be limited to three as illustrated, and is not limited to a linear arrangement, but may include any number of modules arranged to provide DC electrical power when incident radiant energy from the sun impinges thereon.

Module electrical leads 106 are provided between modules 102 that carry electrical power, as it is collected in each module 102 when solar energy shines thereon, to a combiner 108. Combiner 108 is configured, as will be further illustrated, to collect DC electrical power from a few to several (or more) strings of solar modules, and combine the output in a combiner bus bar. As shown in FIG. 1, multiple combiners 108 may be included in system 100 (two of which are illustrated) and outputs therefrom 110 are fed into a master combiner 112 (otherwise known as an array combiner). DC electrical energy from master combiner 112 thus includes DC electrical energy from multiple PV modules 102, arranged in strings 104, which are combined in combiner 108, and output to master combiner 112. As such, master combiner 112 includes, in one embodiment, all modules 102 in system 100, leading to potentially very high total power output of several kW or more during peak energy production. DC electrical power from 112 is output as total system power 114 to an inverter 116. Inverter 116 outputs AC power 118 which may be used for residential or other purposes, or output to the electrical grid, as known in the art.

As known in the art and as will be further illustrated, modules 102 arranged as strings 104 include typically many electrical connections. Strings 104 combine into combiner 108, adding typically many more electrical connections, and when combiners 108 are combined in master combiner 112 and output to inverter 116, still more electrical connections are typically included. Thus, in the system illustrated, typically many electrical connections are included that are susceptible to becoming loose and resulting in overheating and arc faults, as described.

System 100 includes a controller 120 that receives, in one embodiment, instructions for operation, system safety functionality, etc. . . . by computer 122. In one embodiment, controller 120 and computer 122 provide system functionality for automated system operation, manual operation of control, system monitoring, power output monitoring, efficiency, measured solar influx, etc. . . . as is known in the art. Controller 120 and computer 122 provide control features for operation of embodiments of the invention.

In addition, although FIG. 1 illustrates a PV system as is commonly understood within the art, it is contemplated that other PV system arrangements may be included as well, according to embodiments of the invention. For instance, in an alternative embodiment, a PV system may include additional sub-systems, each of which resembles system 100 as illustrated. That is, much larger PV systems may incorporate embodiments of the invention that may include multiple systems 100. System 100 as illustrated may be a sub-system configured as illustrated but as part of a much larger overall DC power supply system comprised of many systems 100, each having its own master combiner 112 and inverter 116. In other words, there may be several systems 100 within a much larger system for PV operation, and the invention is not to be limited to the system 100 illustrated in FIG. 1. In fact, any such arrangement of PV components may be contemplated, according to the invention, in which PV modules are arranged to output power to an inverter, regardless of whether and how such modules are arranged as strings, with combiners, and with master combiners.

Figure 2:
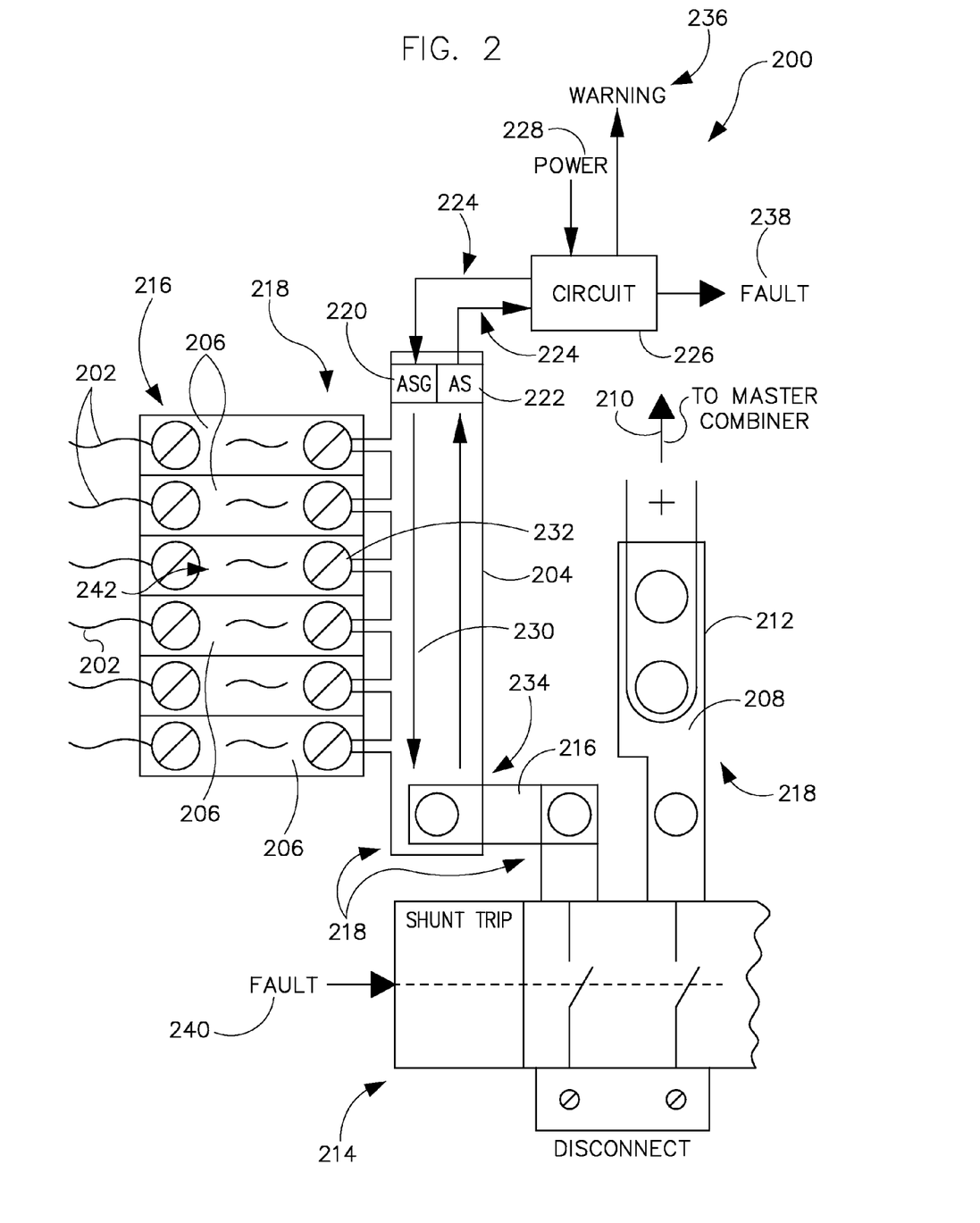
FIG. 2 is an illustration of components of a portion of a combiner box of a PV system, according to embodiments of the invention.

Referring now to FIG. 2, a portion of a circuit 200 within a combiner box, such as combiner box 108 of FIG. 1, is illustrated. Circuit 200 includes inputs 202 from strings of modules, such as module strings 104 of FIG. 1. Inputs 202 are fed to a bus bar 204 which receives electrical power from inputs 202. Each input includes a string protector 206 that provides, in one embodiment, over current protection by use of a fuse or circuit breaker, as known in the art. Bus bar 204 feeds DC power from leads 202 to a power terminal 208, which in turn feeds power to a master combiner 210 via a bus feed cable terminal 212. Circuit 200 includes a trip circuit 214 for disconnecting bus bar 204 from power terminal 208 in the event of a fault, according to the invention. Bus bar 204 is connected to trip circuit 214 via a conductor 216. As seen throughout circuit 200, circuit 200 includes multiple electrical connections 218 that are susceptible to coming loose and leading to overheating and arc faults, as described. As such, according to the invention, an acoustic signal generator (ASG) 220 is acoustically coupled to bus bar 204 and an acoustic sensor (AS) 222 is also acoustically coupled to bus bar 204. ASG 220 and AS 222 are positioned on bus bar 204 proximate one another and each is electrically coupled 224 and controllable via a fault circuit 226. Fault circuit 226 receives power 228 and is configured to operate, and receive information from, ASG 220 and AS 222 respectively. According to the invention, in one embodiment fault circuit 226 is a stand-alone circuit that is dedicated to system fault detection, and in another embodiment fault circuit 226 is included as part of controller 120 and computer 122 of FIG. 1.

Circuit 226 and ASG 220/AS 222 are arranged to detect arc faults within circuit 200 that occur within connections 218. Acoustic signal generator 220 is configured to output an acoustic signal in either 1) a vibration having a constant frequency tone (that can include a continuous or periodic sweep through multiple frequencies), or 2) an acoustic "ping" having a spectrum of audible acoustic frequencies superimposed therein, as examples. That is, ASG 220 either emits a constant frequency tone or causes generation of white-noise by forcing a hammer-like operation to be directly imposed on bus bar 204. Typically, in the illustrated embodiment, if connections 218 are all generally sound and not loose such as to cause overheating or an arc fault, the acoustic noise generated by ASG 220 as a source signal will traverse 230 through bus bar 204 and spread to other components of circuit 200, while encountering electrical connections 218 throughout. Should one of the connections 218 be loose, such as a loose connection 232, a vibration will result between string protector 206 and bus bar 204 that form loose connection 232. Typically, if loose connection 232 occurs, then electrical components to either side of the loose connection 232 will vibrate having a frequency that is distinct and detectable by AS 222. Thus, if ASG 220 causes either a constant frequency emission or a white noise "ping", then a secondary vibration signal will emit from loose connection 232 that is detectable by AS 222.

As can be understood in the art, there is not necessarily a particular frequency that will result from loose connection 232. The frequency at which components vibrate is, in other words, dependent on a number of factors to include but not limited to, size of the components (string protector 206, bus bar 204, connector therebetween), material properties of components, to name a few. However, when such components vibrate due to a loose connection, the vibration will typically have a peak frequency that stands out either against the constant output frequency or as a result of the "ping". That said, the amount of vibration between components may also be a factor of the output frequency, energy from ASG 220, and distance from ASG 220 to loose connection 232. Thus, according to the invention, the total energy input to the ASG 232 may be selected accordingly in order to cause a detectable vibration between components at loose connection 232. Further, because the amount of vibration is also typically a result of the output frequency, according to the invention, instead of outputting a single frequency or tone, the input frequency from ASG 220 may be swept through a wide range of frequencies during operation (e.g. 1 kHz to 100 kHz). Thus, although a "constant frequency acoustic tone" may be implemented according to the invention, it is contemplated that such operation includes sweeping up and down continuously or periodically through many constant acoustic frequencies, over a sweep time, during which the spectrum of noise responses may be monitored for vibration frequencies that are attributable to vibration between components resulting from a loose connection.

As illustrated in FIG. 2, it is contemplated that loose connections may be detected based on signals that traverse to, but not through, the loose connection. That is, as can be seen in FIG. 2, because ASG 220 and AS 222 are located proximate one another, such an arrangement is nevertheless capable of detecting vibrations generated in loose connection 232 because, as stated, the primary acoustic signal from ASG 220 causes a secondary vibration to occur at loose connection 232. Because the acoustic signals are also typically reflected at other joints within system 200, such as a joint 234, the resulting secondary signals or vibrations are distinguishable therefrom.

As such, when a resulting vibration is detected that indicates a loose connection, then circuit 226 may be configured to compare the magnitude and/or frequency of the vibration signal to indicate to a user, via computer 122, either a warning 236 or a fault 238. If none is detected, then circuit 226 may be caused to indicate 'no fault'. One skilled in the art can establish readily what the threshold of vibration frequency and magnitude may be in order to distinguish between 1) a solid joint, 2) a loosening joint, and 3) a loose joint in which an arc fault may occur. As such, when a fault is determined, then a fault signal 240 is sent to trip circuit 214 in order to electrically disconnect bus bar 204 from master combiner 210.

The invention is not limited to a bus bar having and its connection to PV arrays and a master combiner, as illustrated in FIG. 2. Rather, the invention may be applicable to any bar or portion of a circuit in which an acoustic signal may be generated to excite vibration of loose components that form an electrical connection. For instance, a bus bar in an array or master combiner, or a DC bus bar in an inverter, as examples, may be configured having an ASG and AS arranged, as described with respect to FIG. 2, such that a loose connection may be detected.

Further, the invention is not limited to detecting vibration from loose components that have not also had the primary signal pass therethrough. As stated, system 200 operation of FIG. 2 can detect vibration in components that are caused to vibrate, but the source signal itself is not detected on the 'other side' of the loose connection. That is, in the example of FIG. 2, vibration was caused to occur in a joint 232 that is essentially tangential to the path of the source signal 230. In that example, vibration was caused to occur but both the source signal and the secondary vibration signal were both detected without either signal having passed to another side 242 of the joint 232.

Figure 3:
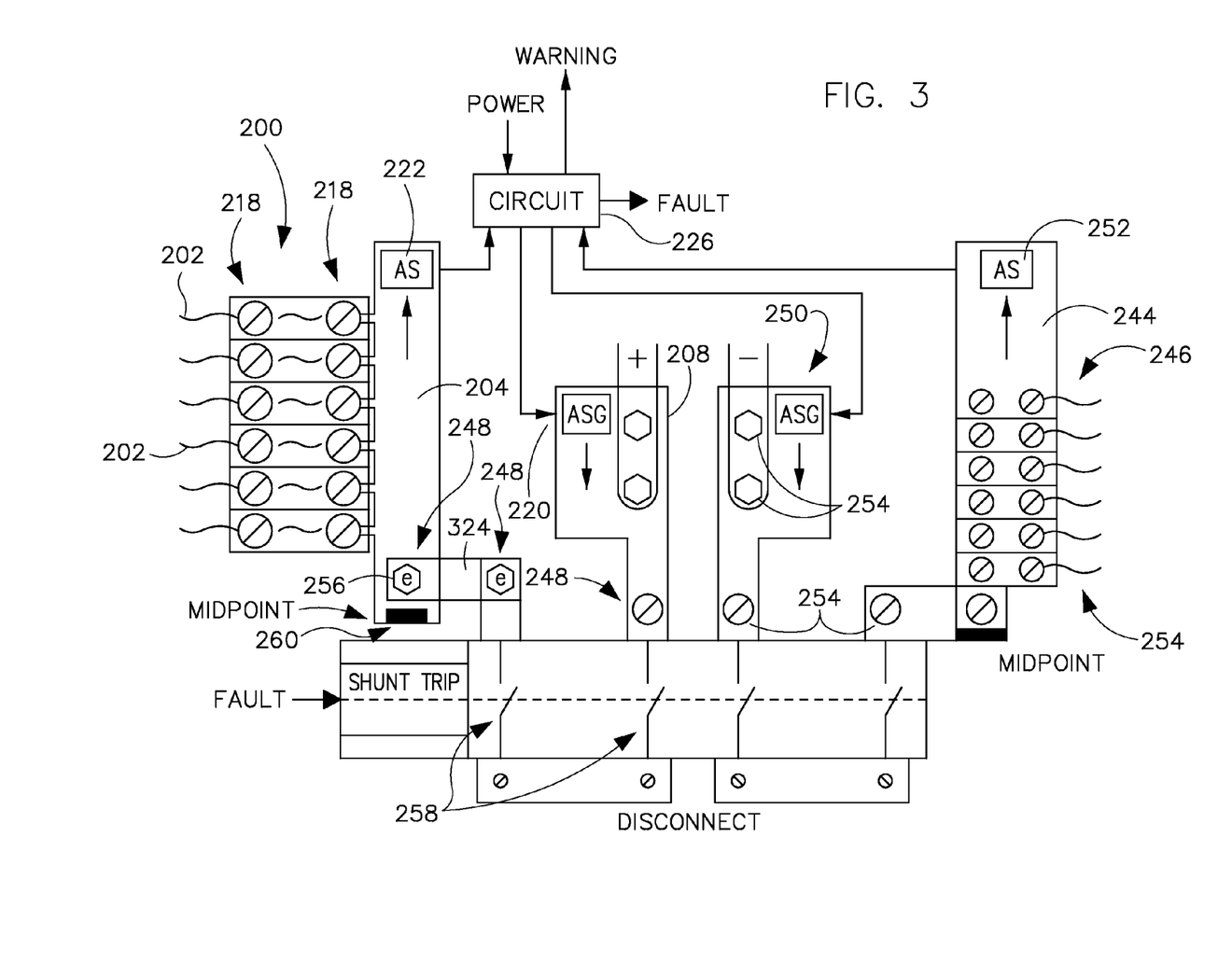
FIG. 3 is an illustration of components of a combiner box of a PV system, according to embodiments of the invention.

Referring now to FIG. 3, components (ASG and AS) may be thus arranged in order to detect resultant secondary vibrations from an acoustic source, wherein the source signal is caused to pass through a loose joint, and the source signal is detectable on the other side thereof. FIG. 3 illustrates that shown in FIG. 2, but includes additional components that correspond to the negative polarity-side of the circuit. That is, FIGS. 2 and 3 illustrate essentially the same circuit layout, but FIG. 2 was limited to the positive polarity side of the circuit for simplicity of illustration. However, FIG. 3 shows both the positive and negative portions of the circuit in order to illustrate that the acoustic source generator ASG may be positioned in one location and the acoustic signal AS may be received at a different location, such that the location of a loose connection may be narrowed to a portion of the circuit and isolated using a disconnect.

Circuit 200 includes bus bar 204 with connections 218 to string protectors 206. Bus bar 204 takes a positive polarity through string protectors 206 and from inputs 202. Circuit 200 includes a second bus bar 244 having a negative polarity and negative strings 246 corresponding to strings 202. That is, each positive string 202 corresponds to a negative line 246 that closes a circuit with each respective string of PV cells (not shown). In the embodiment of FIG. 3, ASG 220 is positioned to generate acoustic signals through electrical joints 248, along bus bar bus bar 204 (proximate electrical connections 218) and to AS 222. In this embodiment, vibrations may be generated in loose joints in joints 248 as well as joints 218. Thus, in this embodiment, AS 222 detects vibrations in both sets of joints 218, 248, and in the case of joints 248, the source signal from ASG 220 is caused to pass through joints 248 as well as proximate joints 218. Vibrations thereby generated can be detectable, according to the invention, with AS 222.

Similarly, a second ASG 250 may be placed on the negative polarity side of the circuit, as well as a second AS 252 such that secondary vibration signals generated in joints 254 may likewise be detected as a result of excitation from ASG 250. Further, because of the second set of ASG 250 and AS 252 of FIG. 3, it is possible to narrow the location of a vibration. By selectively exciting one of the ASGs (220 or 250), detection of a vibration signal may be used to narrow the location of the vibration and thereby disconnect the detected portion of the circuit from further operation, thereby avoiding a potentially dangerous situation. For instance, if a loose connection occurs at location 256, then secondary excitation caused by one of the ASGs 220, 250 may be detected in AS 222 (but not in AS 252) thereby indicating a loose connection somewhere with respect to bus bar 204, which can then be disconnected using one or both disconnect switches 258 to disengage bus bar 204 from the rest of the circuit. In such fashion, it is possible to selectively isolate, or at least narrow down, the location of the loose connection by strategically placing each ASG and AS within a circuit.

It is contemplated that each location of ASG and respective AS may be reversed. For instance, ASG 220 and AS 222 may have their locations reversed, yet loose connections may still be detectable according to the invention. In addition, as stated, AS and/or ASG components may be strategically placed in order to provide additional information on the location of a loose connection, based on where the corresponding ASG and AS are, from which secondary vibrations are caused to occur and are detected. For instance, ASG 220 is positioned on power terminal 208 in the illustration of FIG. 3. However, ASG 220 may instead be positioned at an approximate midpoint 260, with AS 232 located at each "end" of the circuit within the combiner. In so doing, if secondary vibrations are generated as a result of operation of an ASG positioned at midpoint 260, then detected vibrations at AS 222 may more clearly be identified as having been generated at, for instance, electrical connections 218, thus narrowing the possible locations where a loose connection has occurred.

Figure 4:
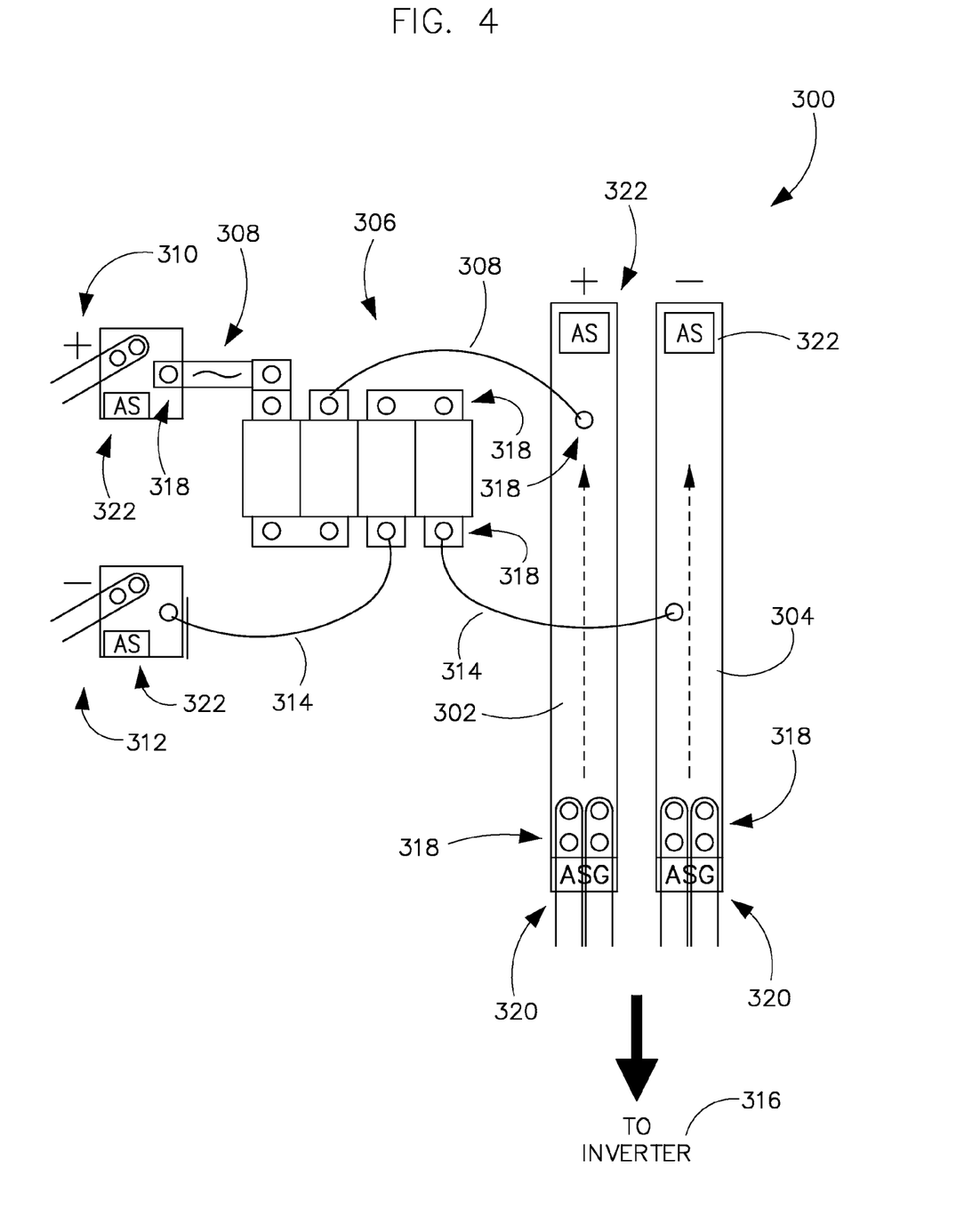
FIG. 4 is an illustration of a master combiner box of a PV system, according to embodiments of the invention.

Acoustic generators and sensors may also be used to identify loose connections within master combiner 112 of FIG. 1. Referring now to FIG. 4, internal components 300 of a master combiner are illustrated including a positive bus bar 302 and a negative bus bar 304. A disconnect 306 is included that includes a fuse on positive polarity line 308 that is connected to a positive polarity source 310 that is connected to a positive polarity portion of a combiner box (such as illustrated in FIG. 3 and in FIG. 1). Negative bus bar 304 is connected to a negative polarity source 312 via negative lines 314. Each bus 302, 304 is connected to an inverter 316, such as inverter 116 of FIG. 1. As seen in FIG. 4, components are connected throughout at connection locations 318 which, as stated, are susceptible to overheating and arc fault if they become loose during system operation. Thus, consistent with the above, ASGs 320 may be included at, for instance, one end of each bus bar 302, 304, and AS locations 322 may be placed on the other end of the bus bars 302, 304 and/or on each terminal connecting to the combiner 310, 312. Although not illustrated for simplicity, as in the other illustrations, each ASG 320 and AS 322 is controlled in the same fashion as described above with respect to the other Figures.

Further, it is contemplated that loose connections are detectable as described in the above embodiments by including a generally solid connection between components through which acoustic signals can travel. That is, although lines 308 and 314 are shown as what may appear to be wires, it is understood that they, and other components of this and the other prior figures, includes materials of sufficient robustness so as to support transmission of acoustic signals. Thus, in the embodiments of FIGS. 2-4 it is understood that in order to generate secondary vibration signals using an ASG, and detect them using an AS, such is possible because of the ability for an acoustic signal to traverse through the components and be detected. As such, the locations of the ASs and ASGs are not limited to the locations illustrated, and they may be placed anywhere in the circuit in order to generate and detect secondary vibrations. And, along those lines, it is possible to further isolate the locations affected by an excitation acoustic signal sent from an ASG. For instance, as stated it is possible to determine approximate or general locations of a loose connection by selectively placing ASGs and ASs within a circuit. However, further isolation may be caused to occur by using a material, such as a copper braid, that can conduct electricity while not mechanically conducting or propagating an acoustic signal.

For instance, referring back to FIG. 3, typically a connector for the relatively high power of several strings of PV modules is made of a solid material such as copper. Connector material 324, for instance, may normally be made of a solid material that inherently conducts electricity and conducts an acoustic signal. However, according to the invention, material 324 may be replaced with a copper braid such that acoustic signals are precluded or prevented from passing therealong. Thus, in the embodiment where an ASG is positioned at midpoint 260 and vibration signals are detected at AS 222, including a copper braid instead of material 324 thus prevents acoustic signals from propagating therethrough and to other AS locations where a vibration signal could be detected. As such, use of a copper braid in portions of the overall PV system (as typically found at the movable contacts within a circuit breaker) may be used in conjunction with selective placement of ASGs and ASs in order to provide further narrowing features to locate portions of the circuit where a loose connection develops.

In lieu of using acoustic signals to generate secondary vibrations for detection of loose connections that can lead to overheating or an arc fault, according to the invention, electrical signals can be used for additional components within a PV system. As stated, some components within a PV system are not interconnected with components that would inherently propagate acoustic signals. As one example, PV modules are typically interconnected using wires that are relatively structurally flexible and thus would not support transmission of an acoustic signal. That is, because the total power transmitted between modules and within a string is relatively low, the electrical conduction requirements between the modules is typically quite small when compared to, for instance, the amount of power transmitted within a combiner box, or within a master combiner. The acoustic embodiments previously discussed may not suffice between modules of a string. As such, in lieu of using an acoustic signal generator ASG and a sensor for sensing an acoustic signal AS, an electrical signal may be generated and caused to go through electrical joints in order to determine, when a loose connection develops, and where that loose connection is.

Figure 5:
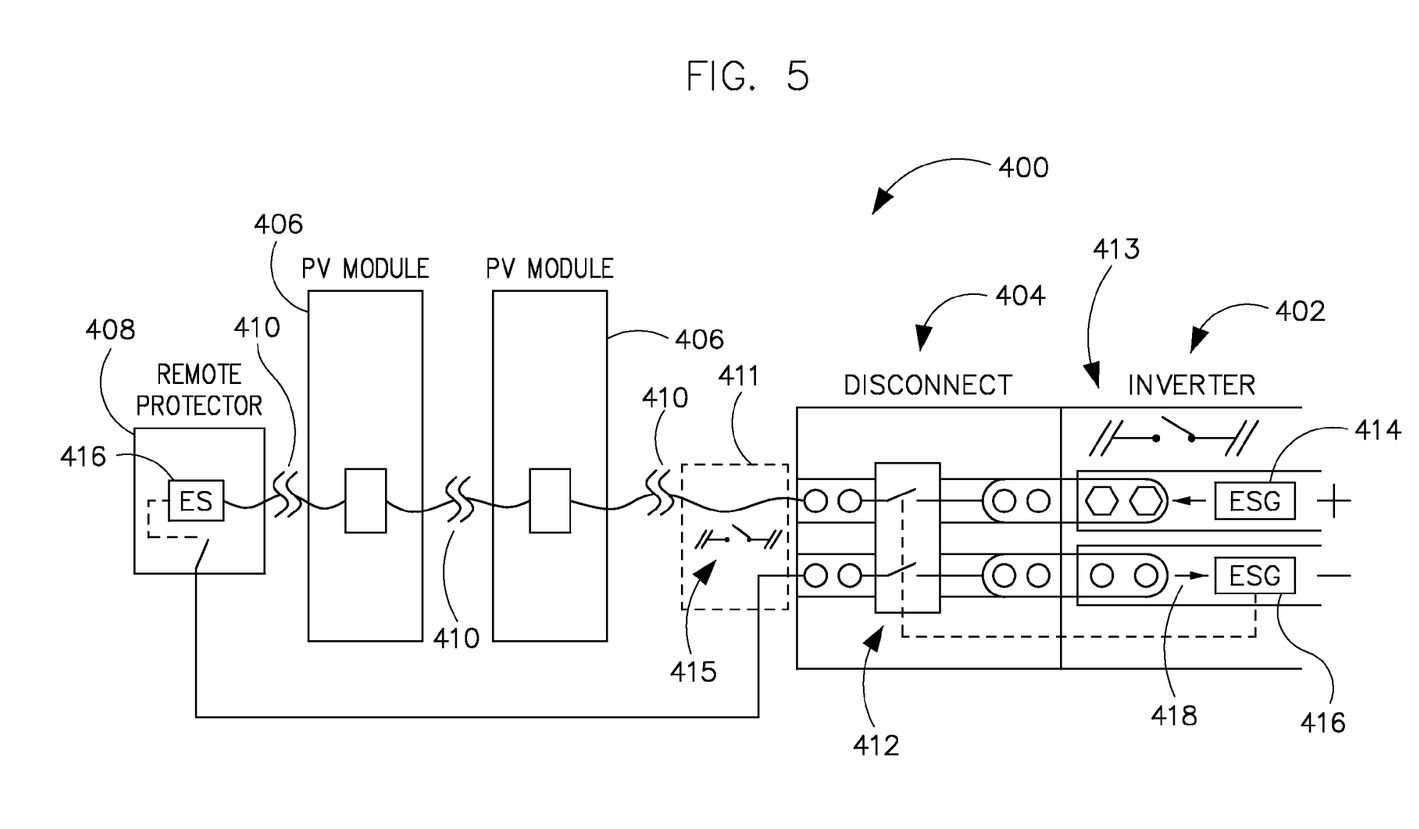
FIG. 5 is an illustration of a PV system, according to embodiments of the invention.

Referring to FIG. 5, portions of a PV circuit 400, as illustrated in FIG. 1, are illustrated therein. Circuit 400 shows an inverter 402, a disconnect 404, and PV modules 406. A remote protector 408 (such as a ground fault circuit interrupter (GFCI)) is electrically coupled to one of the PV modules 406 at the end of the circuit. In-line connectors 410 are shown which clearly illustrate that there are additional connections within PV circuit 400, consistent with that shown in FIG. 1. PV circuit 400 also includes, but does not illustrate again for simplicity of illustration, a controller 120 and computer 122, as illustrated in FIG. 1, which are also configured to control operation of disconnect 412.

An electrical signal generator (ESG) 414 is positioned, in the embodiment illustrated, on the inverter 402 and electrical signals generated therefrom are caused to pass through disconnect 404 (assuming switches therein are closed) and caused to pass through PV modules 406 to electrical signal sensor (ES) 416 positioned on remote protector 408. Circuit 400 may include also an ES 416 on the return line 418 of inverter 402. According to the invention, ES 416 and those described herein, may be configured to detect electrical signals but according to the invention may also include a detection capability for acoustic signals as well.

In operation of one embodiment, various frequency AC electrical signals are caused to emit from ESG 414 that pass through the electrical components to ES 416. According to other embodiments of the invention, ESG 414 is one or more power switches 413 within an inverter, such as inverter 402, or one or more switches 415 within a DC-DC converter, such as an optional DC-DC converter 411, that is within PV circuit 400. Thus, if no loose electrical connection is present through which the AC signal passes, then the AC signal passes unimpeded and is detectable at each ES 416. As such, computer 122 may be caused to indicate a 'no fault' indication to a user. However, as discussed with respect to FIG. 2, ESG 414 and ESs 416 are connectable to a circuit of system 100 (circuit 220 of FIG. 2) which may be controllable via controller 120 and interfaced using computer 122, such that the AC electrical signals are generated at ESG 414 and detected at ESs 416. When a loose connection is present and the AC signal is caused to go through it, distortion of the signal occurs in that the electrical signal is detectably distorted or attenuated. Accordingly, circuit 226 (as discussed with respect to FIG. 2) may be thereby caused to indicate either a warning or a fault via computer 122.

As such, in portions of a PV system in which acoustic signals may be precluded from passing therethrough, it is possible nevertheless to detect loose connections by using an AC electrical signal generator and an electrical signal detector, which can be used to monitor the AC signal and ascertain when distortion or attenuation of the signal occurs due to a loose connection. As with the acoustic embodiments, the ESGs and the ESs can be selectively or strategically placed throughout the PV system such that, if and when a loose connection occurs, its location can be likewise narrowed. In other words, the more ESG and ES components that are placed, the more opportunity there is to narrow the location of the loose connection when it occurs. Further, referring still to FIG. 5, it is contemplated that the locations of the ESG and ESs may be reversed, as one example.

Figure 6:
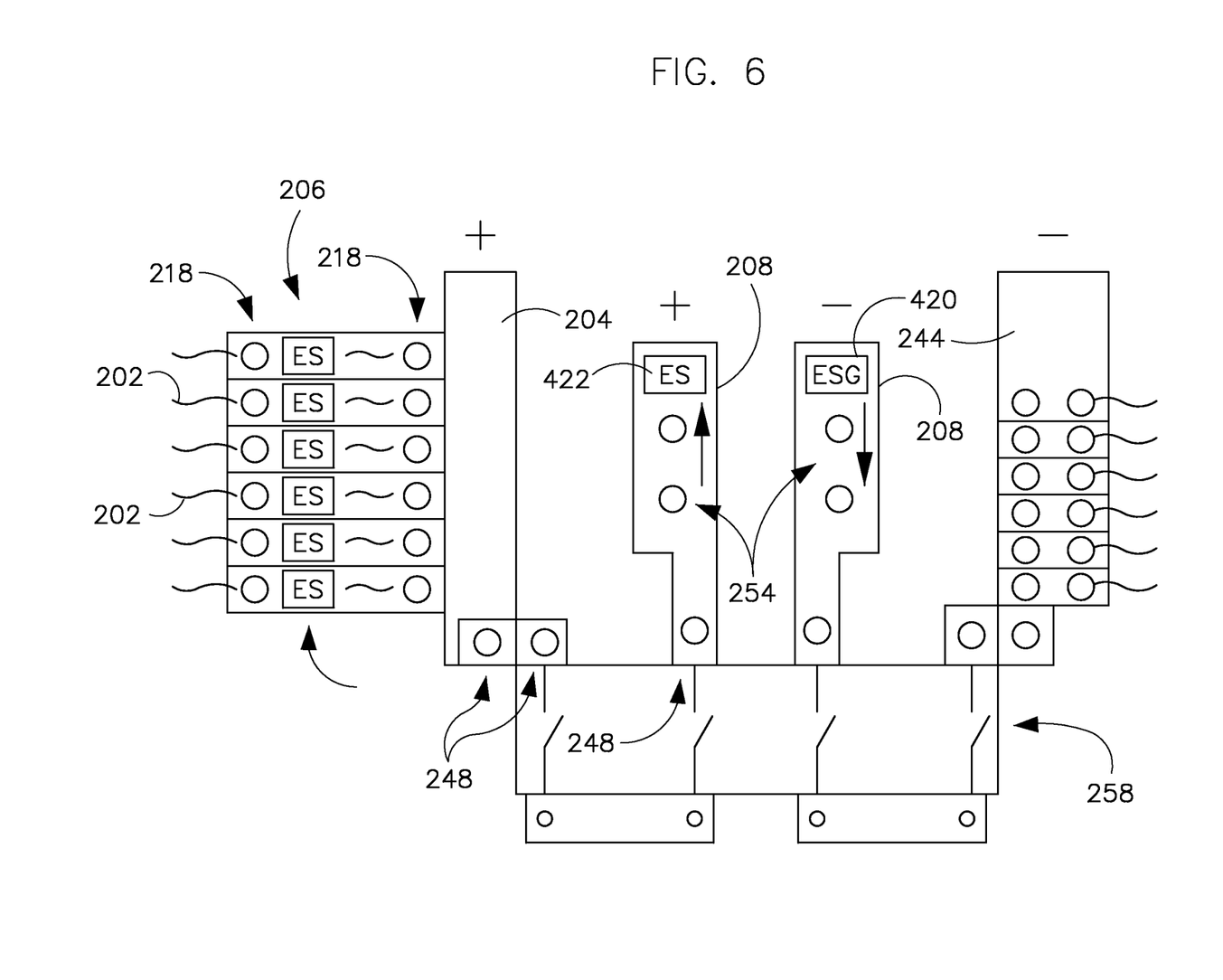
FIG. 6 is an illustration of components of a combiner box of a PV system, according to embodiments of the invention.

Referring now to FIG. 6, components of a combiner box are illustrated according to the invention. Similar to FIG. 3, FIG. 6 illustrates a first positive bus bar 204, a second negative bus bar 244 and power terminals 208. Electrical joints 254 are connectable to power leads that pass to a master combiner box (not shown). String protectors 206 provide overcurrent protection to strings 202. Electrical joints 248 are also formed that provide a disconnectable path from terminals 208 to bus bars 204, 244 via disconnect switches 258. Electrical connections 218 connect string protector 206 to bus bar 204 and to strings 202. As stated, connections 218, 248, and 254 are susceptible to overheating or arc fault if a loose connection develops. As described with respect to FIG. 3, a control or fault circuit 226 is included to provide operational control of disconnect switches 258, but circuit 226 is not shown for simplicity of illustration.

As with in FIG. 3, such loose connections may be detected using acoustic signal generators and detectors. However, according to the invention, placement of electrical signal sources and detectors may be used in lieu of acoustic generators and sensors. Thus, in FIG. 6 an ESG 420 may be positioned on for instance the negative terminal of power terminals 208, which can be caused to generate an electrical signal throughout the combiner box. Electrical signal sensors (ES) may be selectively placed in order to enable a computer to pinpoint a location of a loose connection. ES 422 may be placed for instance on the positive terminal of power terminal 208, and/or ESs 422 may be placed on each of the strings 206, as examples. As such, monitoring the generated AC electrical signal from ESG 420 can be performed in multiple locations and, when the signal becomes distorted or attenuated due to a loose connection, its location can be located or narrowed to specific locations of the overall circuit, and based on the degree of distortion or attenuation, a user can either be warned of a possible loose connection or notified of an actual fault.

Figure 7:
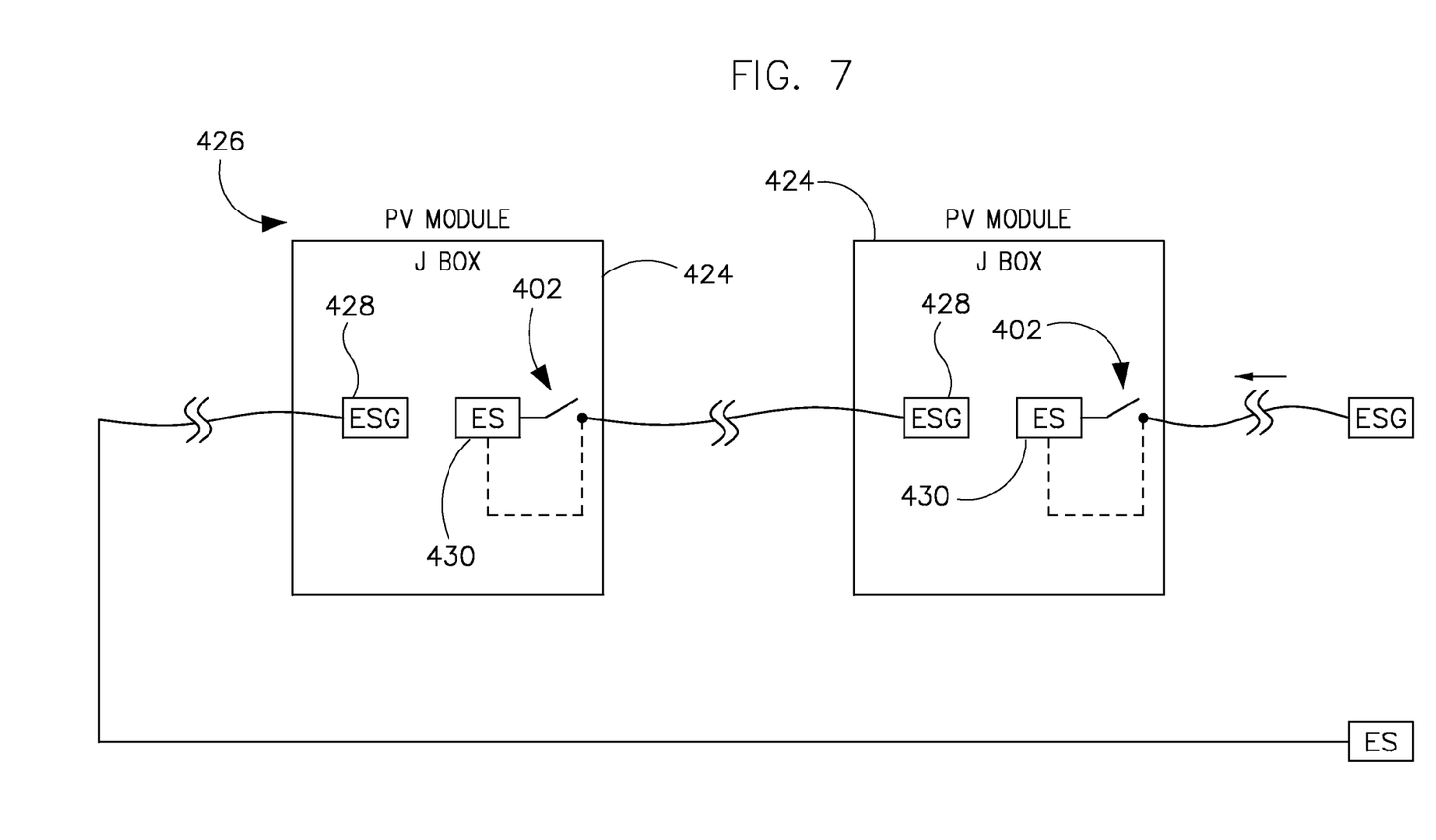
FIG. 7 is an illustration of a string of PV modules, according to embodiments of the invention.

Referring to FIG. 7, individual modules 424 (or sub-groups of individual modules of, for instance two or three PV modules) of a string of PV modules 426 can be protected using selectively placed ESGs 428 and ESs 430. In this embodiment, each ES 430 includes its own respective disconnect switch 432 that is controllable by a fault detection circuit (such as fault circuit 226 of FIG. 2). Thus, in this embodiment, yet narrower portions of the PV circuit, down to specific PV modules 424, may be monitored and remotely disconnected according to the invention.

The embodiments of the invention illustrated are in no way meant to limit the locations and numbers of components used to monitor and detect loose connections in a PV system. Locations are illustrated for placement of acoustic generators and sensors pertaining to FIGS. 2-4, and for placement of electrical AC signal generators and sensors pertaining to FIGS. 5-7. However, in portions of the PV circuit where acoustic signals can pass proximate to or through connections such that a resulting secondary acoustic signal is generated, the acoustic signal generators and detectors can be selectively placed to monitor several connections and down to as little as one connection, depending on the placement of the acoustic generator and sensor components. Similarly, in lieu of using acoustic sensors, electrical generators and sensors may be used to pass a detectable AC signal through one or more connections of the PV system and, when such signal becomes distorted or attenuated due to a loose connection, such location can be pinpointed based on the locations where the AC signal is generated and where the AC signal and its distorted/attenuated signal is detected. According to the invention, controller 120 and computer 122 are configured to operate such that a time-correlation is recognized during operation to detect a loose connection. That is, signal generators (ASGs and ESGs) described above are operated in such a fashion that resulting vibrational signals are detected that can be correlated to the signal, from either an ASG or an ESG, that is used to cause the vibration to occur. In such fashion false signals may be reduced and, because the resultant vibration signal may be detected temporally proximate to when the signal is used to generate the vibration, signal to noise ratio may be improved as well.

An implementation of embodiments of the invention in an example comprises a plurality of components such as one or more of electronic components, hardware components, and/or computer software components. A number of such components can be combined or divided in an implementation of the embodiments of the invention. An exemplary component of an implementation of the embodiments of the invention employs and/or comprises a set and/or series of computer instructions written in or implemented with any of a number of programming languages, as will be appreciated by those skilled in the art.

An implementation of the embodiments of the invention in an example employs one or more computer readable storage media. An example of a computer-readable signal-bearing medium for an implementation of the embodiments of the invention comprises the recordable data storage medium of the image reconstructor 34, and/or the mass storage device 38 of the computer 36. A computer-readable storage medium for an implementation of the embodiments of the invention in an example comprises one or more of a magnetic, electrical, optical, biological, and/or atomic data storage medium. For example, an implementation of the computer-readable signal-bearing medium comprises floppy disks, magnetic tapes, CD-ROMs, DVD-ROMs, hard disk drives, and/or electronic memory.

According to one embodiment of the invention a power circuit configured to generate and distribute DC electrical power, the power circuit includes a photovoltaic (PV) system that includes an array of PV modules electrically coupled to a combiner box, and an inverter positioned to receive DC electrical power from the array of PV modules and output AC electrical power. The PV system also includes a signal generator coupled to a first portion of the PV system, and a signal detector coupled to a second portion of the PV system, the signal detector configured to detect secondary signals generated at a loose connection of an electrical joint in the PV system, wherein the secondary signals result from a signal generated by the signal generator.

According to another embodiment of the invention a method of manufacturing a loose connection detection system in a photovoltaic (PV) circuit includes attaching a signal generator to the PV circuit such that a signal generated therefrom passes to a signal detector attached to the PV circuit, and attaching the signal detector to the PV circuit to detect secondary signals generated at a loose connection within the PV circuit that result from the signal generated by the signal generator.

According to yet another embodiment of the invention a computer readable storage medium having stored thereon a computer program comprising instructions, which, when executed by a computer, cause the computer to generate a source signal in a signal generator that is attached to a photovoltaic (PV) electrical power circuit such that the source signal generated therefrom passes at least to an electrical connection between electrical components of the PV electrical power circuit, detect the source signal using a signal detector that is positioned to receive the source signal, and detect a secondary signal using the signal detector, the secondary signal generated at the electrical connection that results from a loose connection of the electrical components at the electrical connection.

A technical contribution for the disclosed method and apparatus is that it provides for a computer-implemented apparatus and method of for detecting a loose electrical connection in a photovoltaic (PV) system.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A power circuit configured to generate and distribute DC electrical power, the power circuit comprising:
   a photovoltaic (PV) system comprising:
      an array of PV modules electrically coupled to a combiner box; and
      an inverter positioned to receive DC electrical power from the array of PV modules and output AC electrical power;
   a signal generator coupled to a first portion of the PV system, wherein the signal generator is an acoustic signal generator; and
   a signal detector coupled to a second portion of the PV system, the signal detector configured to detect secondary signals generated at a loose connection of an electrical joint in the PV system, wherein the secondary signals result from a signal generated by the signal generator, wherein the signal generator and the signal detector are positioned such that an acoustic signal generated by the signal generator and detected by the acoustic signal detector does not pass through the loose connection at which the secondary signals are generated.

2. The power circuit of claim 1 wherein the signal generator is configured to generate an acoustic signal as one of:
   a constant frequency acoustic tone that is swept through a range of frequencies during operation; and
   an acoustic ping having a spectrum of audible acoustic frequencies superimposed therein.

3. The power circuit of claim 2 further comprising a master combiner having a master bus bar, the master bus bar having the combiner box electrically coupled thereto, wherein the master bus bar comprises the first portion of the PV system, and wherein the second portion of the PV system is a component that is within the master combiner.

4. The power circuit of claim 3 wherein the combiner box is electrically connected to the master combiner via a copper braid to such that acoustic signals do not propagate through the copper braid.

5. The power circuit of claim 2 wherein:
the combiner box comprises a metallic bus bar having an individual strings of PV modules, of the array of PV modules, coupled thereto to form the electrical joint having the loose connection; and
the second portion is a second surface of the metallic bus bar, wherein the signal detector is acoustically coupled to the second surface and configured to detect the acoustic signal that passes through the metallic bus bar.

6. The power circuit of claim 5 wherein the first portion is a first surface of the metallic bus bar, wherein the signal generator is an acoustic signal generator acoustically coupled to the first surface and positioned to generate the acoustic signal that passes through the bus bar, wherein the signal detector is positioned to detect vibrations as the secondary signals that are generated at the loose connection, and configured to output an electrical signal that corresponds with the detected vibrations.

7. The power circuit of claim 1 wherein the signal generator is one of an AC electrical signal generator, a power switch within an inverter, and a power switch within a DC-DC converter, wherein the signal detector is positioned to detect:
one of an electrical signal and an acoustic signal as the secondary signals generated at the loose connection; and
electrical signals generated from the AC electrical signal generator.

8. The power circuit of claim 7 wherein:
the first portion of the PV system is an electrical connector of the inverter; and
the second portion of the PV system is one of:
a remote protector of a string of PV modules within the array of PV modules; and
another electrical connector of the inverter.

9. The power circuit of claim 8 wherein:
the first portion of the PV system is a main power terminal within the combiner box; and
the second portion of the PV system is one of:
a string protector within the combiner box; and
another main power terminal within the combiner box.

10. The power circuit of claim 8 wherein:
the first portion of the PV system is an electrical component within one PV module of the array of PV modules; and
the second portion of the PV system is another electrical component within another PV module of the array of PV modules.

11. The power circuit of claim 1, further comprising one or more disconnect switches that are selectively operable to isolate a location of the loose connection.

12. A method of manufacturing a loose connection detection system in a photovoltaic (PV) circuit comprising:
attaching a signal generator to the PV circuit such that a signal generated therefrom passes to a signal detector attached to the PV circuit, wherein the signal generator is configured to generate an acoustic vibration as a ping having a spectrum of audible frequency components superimposed therein; and
attaching the signal detector to the PV circuit to detect secondary signals generated at a loose connection within the PV circuit that result from the signal generated by the signal generator;
wherein the signal generator and the signal detector are positioned such that the acoustic vibration generated by the signal generator and detected by the acoustic signal detector does not pass through the loose connection but passes adjacent the loose connection at which the detected vibration is generated.

13. The method of claim 12 comprising:
configuring a controller to monitor the signal detector to:
determine a status of the electrical connection based on the signals detected at the signal detector; and
indicate to a user the status of the electrical connection as one of a no fault, a fault, and a warning of possible fault.

14. The method of claim 12 wherein:
the signal generator is configured to generate the acoustic vibration as a constant frequency tone that is swept through a range of frequencies during operation; and
the signal detector is an acoustic signal detector.

15. The method of claim 12 wherein:
the signal generator is configured to generate an electrical signal; and
the signal detector is configured to detect electrical signals generated as the secondary signals at the loose connection; wherein
the first portion of the PV system is one of:
an electrical connector of an inverter;
a main power terminal within a combiner box; and
an electrical component within a PV module of an array of PV modules; and
the second portion of the PV system is one of:
a remote protector of a string of PV modules within the array of PV modules;
another electrical connector of the inverter;
a string protector within the combiner box;
another main power terminal within the combiner box; and
another electrical component within another PV module of the array of PV modules.

16. The method of claim 12 wherein the PV circuit comprises:
a first plurality of solar modules connected in series to form a first string;
a second plurality of solar modules connected in series to form a second string;
a combiner box having the first string connected in parallel with the second string;
a master combiner having the combiner box connected in parallel with at least one other combiner box; and
a power inverter configured to receive DC power from the master combiner and output an AC current;
wherein the electrical connection is formed in or between components of one of the strings, the combiner box, the master combiner, and the power inverter.

17. The method of claim 12, further comprising selectively operating one or more disconnect switches to isolate a location of the loose connection.

18. A non-transitory computer readable storage medium having stored thereon a computer program comprising instructions, which, when executed by a computer, cause the computer to:
generate a source signal in a signal generator that is attached to a photovoltaic (PV) electrical power circuit such that the source signal generated therefrom passes at least to an electrical connection between electrical components of the PV electrical power circuit;
detect the source signal using a signal detector that is positioned to receive the source signal;

detect a secondary signal using the signal detector, the secondary signal generated at the electrical connection that results from a loose connection of the electrical components at the electrical connection; and selectively isolate the secondary signal by operating a disconnect switch.

19. The computer readable storage medium of claim 18 wherein the computer is further caused to generate the source signal as one of:

an acoustic signal having one of:
 a constant frequency that is swept through a wide range of frequencies during operation; and
 a ping having a spectrum of audible frequency components superimposed therein; and an AC electrical signal.

20. The computer readable storage medium of claim 18 wherein, when the source signal is the acoustic signal, the signal detector is positioned to detect vibrations as the secondary signals that are generated at the loose connection, but do not pass through the loose connection, and configured to output an electrical signal that corresponds with the detected vibrations.

21. The computer readable storage medium of claim 19 wherein, when the source signal is the AC electrical signal, the signal detector is positioned to detect:

electrical signals as the secondary signals generated at the loose connection; and electrical signals generated from the AC electrical signal generator.

22. The computer readable storage medium of claim 18 wherein the computer is further caused to indicate the status of the electrical connection to a user, the indication being one of a no fault, a fault, and a warning of possible fault and based on the detected resultant vibration.

23. The computer readable storage medium of claim 22 wherein the computer is further caused to indicate the fault as one of an audio signal and a light indicator.

\* \* \* \* \*